United States Patent [19]

Lee

[11] Patent Number: 4,660,089

[45] Date of Patent: Apr. 21, 1987

[54] IMAGE SENSOR HAVING NORMALIZED AREAL CONDUCTIVE ELEMENTS TO EFFECT UNIFORM CAPACITATIVE LOADING

[75] Inventor: Alan Lee, Irvine, Calif.

[73] Assignee: Eastman Kodak Company, Rochester, N.Y.

[21] Appl. No.: 757,702

[22] Filed: Jul. 22, 1985

[51] Int. Cl.[4] .......................... H04N 3/14; H03K 3/42
[52] U.S. Cl. .................................... 358/213; 307/311
[58] Field of Search ................... 358/213; 357/24 LR; 307/311

[56] References Cited

U.S. PATENT DOCUMENTS 4,322,638  3/1982  Lee et al. .............................. 307/311
4,322,752  3/1982  Bixby .................................. 358/213

Primary Examiner—L. T. Hix
Assistant Examiner—David M. Gray
Attorney, Agent, or Firm—Dan Robbins

[57] ABSTRACT

In an area image sensor, the on-chip capacitances driven by the sensor photosite elements during sensor readout are made equal. This is accomplished by adjusting the lengths and widths of the conductors (and leads) carrying the output signals so that each signal conductor (and lead) covers equal areas on the sensor substrate. Additionally, the invention teaches fabricating individual integrated circuit buffer amplifiers on the sensor chip which isolate the normalized capacitances from loading effects due to externally connected circuits.

8 Claims, 3 Drawing Figures

IMAGE SENSOR HAVING NORMALIZED AREAL CONDUCTIVE ELEMENTS TO EFFECT UNIFORM CAPACITATIVE LOADING

BACKGROUND OF THE INVENTION

1. Field of the Invention

This invention relates to an area image sensor and, in particular to a sensor with improved output signal uniformity.

The invention, as well as the prior art, will be described with reference to the figures wherein.

2. Description Relative to the Prior Art

A representative solid-state sensor is comprised of charge integrating photosites (e.g., photocapacitors, photodiodes, etc.) arranged in rows and columns. The amount of charge integrated per unit time at each photosite is proportional to the intensity of the radiation incident on the photosite. Imaging a scene onto an area image sensor, therefore, results in a spatial distribution of charge packets wherein the amount of charge in each respective packet represents a corresponding picture element, or pixel, of frame information.

It is known that the charge distribution of an area image sensor may be read out in a serial line format, a parallel line format, or a block format. The selection of a readout technique involves a trade-off between the time taken to read out the sensor and the number of electronic channels required to process the read out information. For a given rate of read out, serial line readout is the slowest technique, albeit that it requires only one processing channel. Parallel line readout, on the other hand, is the fastest technique but it requires a processing channel for each sensor line. The block format amounts to a compromise: It provides sufficient readout speed for use with fast frame sensors (i.e., frame rates up to 2000 frames per second) and requires only as many processing channels as there are sensor rows per block.

U.S. Pat. No. 4,322,752, issued Mar. 30, 1982, in the name of James A. Bixby, discloses the block format technique applied to a solid-state area image sensor for obtaining high frame rates. In accordance with that disclosure, the sensor is read out in blocks of photosites, with each block being comprised of a plurality of adjacent photosite rows. The output signal so produced is, therefore, comprised of block information in a "serial" format, while the information content of each block is comprised of a plurality of line signals in a "parallel" format . . . such line signals corresponding to the individual photosite rows within the block. A block readout sensor, such as that presently to be described, may contain 192 rows arranged in 12 blocks of 16 rows to a block.

U.S. Pat. No. 4,322,638, issued Mar. 30, 1982, in the names of T. H. Lee and R. P. Khosla, discloses a block readout area image sensor. This sensor employs a MOS photocapacitor array, and includes a read channel for each row extending the length of such row. Charges accumulated at photosites within a given row are sequentially dumped, under control of column gating, into the row read channel, the resultant change in potential of which is sensed to provide output signal information. The row signal outputs are aggregated into blocks by means of appropriate block gating as taught in U.S. Pat. No. 4,322,752.

Figure 1:
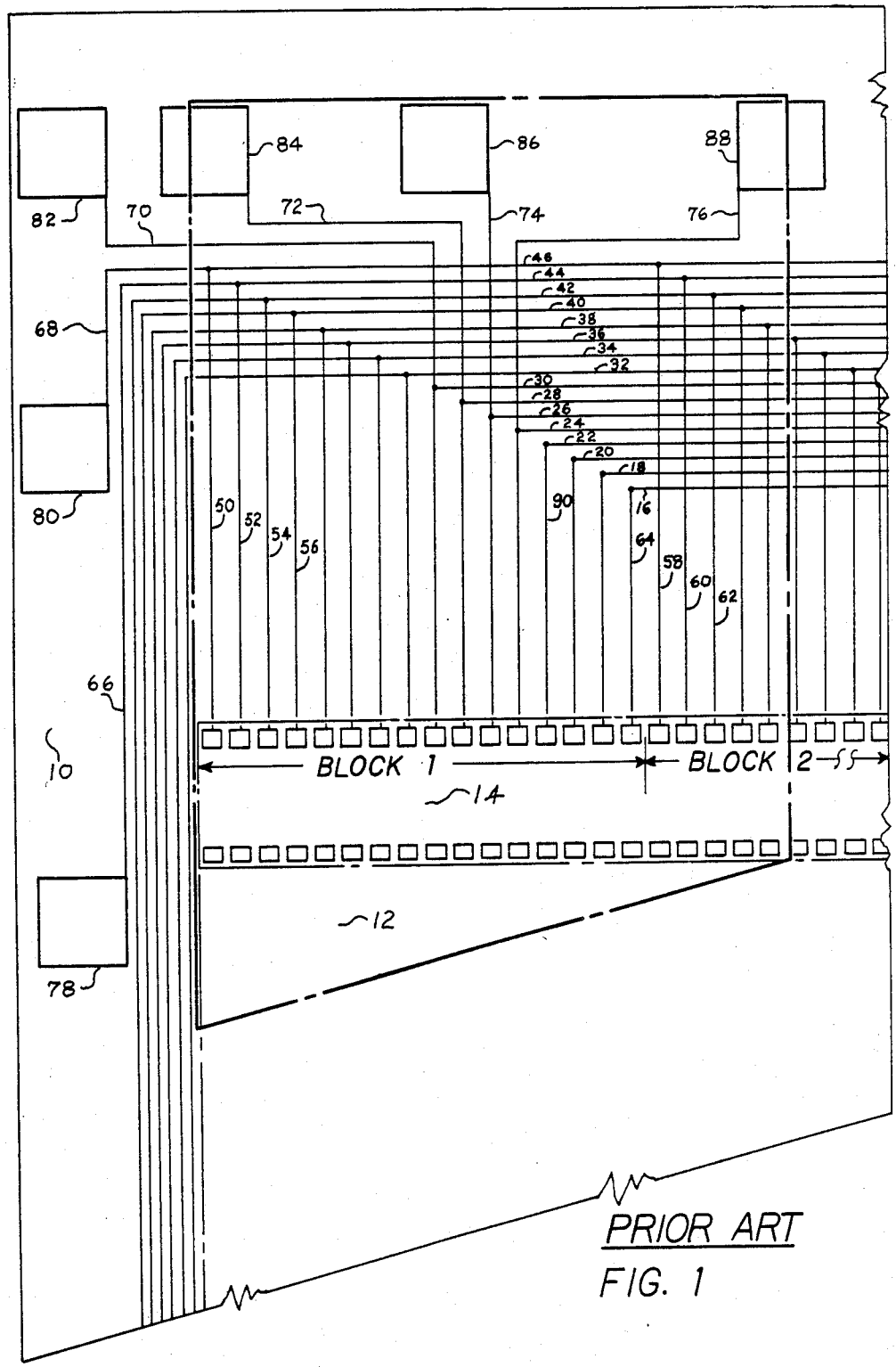
FIG. 1 is a schematic drawing representing a portion of a typical prior art sensor.

An appreciation of the general arrangement of elements of a block format sensor may be obtained by reference to FIG. 1 which schematically represents a portion of one corner of a sensor chip. This schematic representation not only shows the interconnection among the elements of a sensor, but also generally indicates the physical locations of the elements on the sensor substrate and the routing of the sensor circuit interconnections: The schematic drawing, thus, closely approximates a layout drawing of the same section of the sensor. The sensor is fabricated on a semiconductor substrate 10 upon which the sensor elements are deposited. Such elements include a photosite region 12, a selector gate region 14, a block matrix consisting of sixteen bus conductors 16 through 46, and a set of 192 conductors (one associated with each row), of which the conductors 50, 52, 54, 56, 58, 60, 62, 64, 90 are typical. As indicated, the set of 192 conductors connect the selector gates of region 14 with the sixteen bus conductors 16 through 46. Additionally, there are sixteen output leads typically illustrated by the leads 66, 68, 70, 72, 74, 76 which connect to sixteen signal output pads of which the pads 78, 80, 82, 84, 86, 88 are representative. Referring to FIG. 1, and recalling the teaching of U.S. Pat. No. 4,322,752, it will be appreciated that the block matrix is formed by successively connecting groups of sixteen sensor row outputs to the sixteen bus conductors 16 through 46. For example, in the first block, photosite rows are connected by means of conductors (e.g. 50, 52, 54, etc.) to bus conductors (46, 44, 42, etc.) and the rows of the second block are connected to the same bus conductors by means of different conductors (58, 60, 62, etc.). This procedure is continued throughout the 192 sensor rows resulting in 12 blocks of 16 rows per block connected to the one set of bus conductors 16 through 46.

If any output conductor or any bus conductor has an electrical characteristic which causes signals transmitted by such a conductor to differ from the signals transmitted by other conductors, it will be seen that—due to the method of forming the block matrix—such a difference will repetitively occur in each block and, attendantly, cause unacceptable artifacts to appear in the image produced by means of the sensor: If the signal characteristics of, say, output leads 68, 70, 72 differed from those of other output leads, then—in an image produced by means of the sensor—every line of the image display associated with the leads 68, 70, 72 would be of a different intensity than would the lines composing the rest of the image. Such intensity variation would appear in each image block and would result in unacceptable "banding" in the image.

Figure 2:
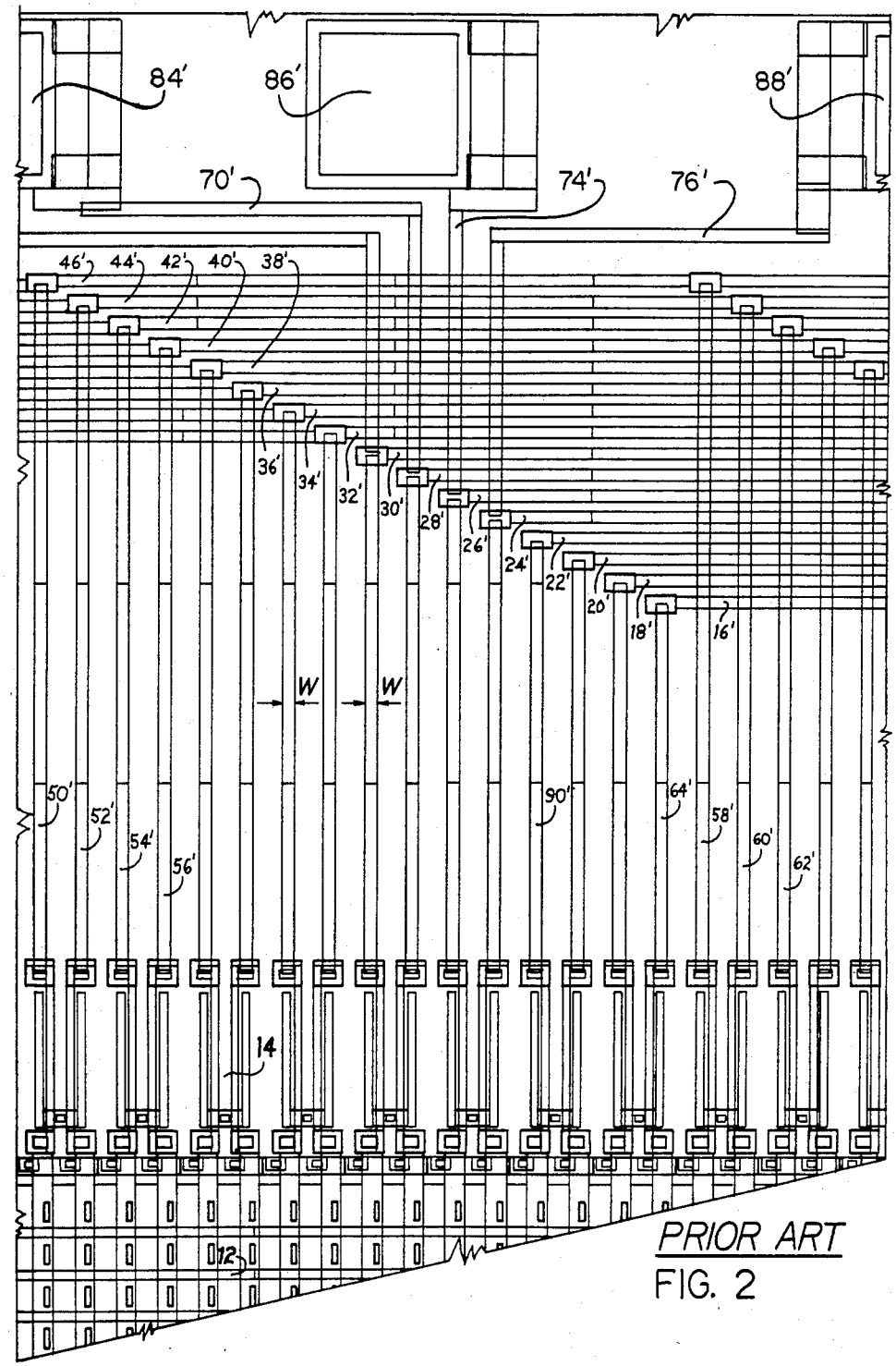
FIG. 2 is an expanded layout drawing corresponding to a section of FIG. 1 useful in understanding a problem addressed by the invention.

Banding in a prior art sensor may be further understood by reference to FIG. 2: This figure illustrates a physical layout of the sensor elements included within the heavy dashed lines of FIG. 1. [In the drawings different but related elements are identified with the same reference characters, albeit that corresponding elements in the various drawings are distinguished by the use of primes.] It will be appreciated that such a layout drawing shows the sensor elements many times magnified. An actual sensor chip for a 192 line image sensor may have dimensions of only 0.3"×0.3", and the small size and complex geometry of the sensor limit sensor design freedom in conductor routing and in the placement of output pads. As a result the different signal paths from the 192 photosite rows to the output pads may be of different lengths. The conductor 64', for example, is not as long as its neighboring conductor 58', and the output conductor 74' is not as long as the output conductor 76'. Such nonuniformity of conductor length appears throughout the geometry of the sensor.

In the fabrication of the sensor, the conductors are metallic ribbons deposited on a passivated insulating surface layer atop the semiconductor substrate 10. A conductor (or lead), therefore, not only serves to connect sensor elements, but also becomes part of a parallel plate capacitor . . . with the conductor serving as one plate, the semiconductor substrate as the other plate, and the insulating surface layer acting as the between-plate dielectric. Such a capacitor has capacitance $$C = \epsilon A/d,$$

where $\epsilon$ is the permittivity of the surface layer, d is the thickness of the surface layer and A is the area of the plate, i.e. the area of the conductor itself. As seen in FIG. 2, the conductors are of constant width (w), and hence their respective areas (A=wl, where l corresponds to conductor length) are all different; capacitances associated with the conductors are, attendantly, all different as well. As previously described, the charge integrated at each photosite is dumped onto a row read channel. The output capacitance existing at each row read channel consists of the read channel capacitance itself plus all the capacitances of the conductors connecting the read channel to a signal output pad. Because the photosite array and the gate selector array are uniform from row to row, and from photosite to photosite, the variation in any capacitance driven by a read channel is due—almost exclusively—to that contributed by the conductor capacitance that is associated with such a channel. When the charge from a photosite is dumped into a row read channel, the potential of that channel becomes $$V = q/C,$$

where q is the amount of charge, and C is the total capacity driven by the read channel. Assuming equal charge production at each photosite, uniform illumination of the sensor will result in varying voltage outputs from the sensor rows depending upon the total capacitance driven by each channel. The capacitance variation, therefore, would cause banding in a scene reproduced by a system utilizing the sensor.

In a camera using a block readout type sensor, individual adjustments are usually provided for each row of parallel-connected blocks to compensate for the aforesaid problem of variations in capacitance. The present invention solves such problem by equalizing the signal conductor capacitances on the sensor substrate and essentially obviates the requirement for row by row correction for capacitance variation.

SUMMARY OF THE INVENTION

Unlike the prior art sensor, where signal conductor capacitances driven by read channels are not directly controlled in sensor layout design, the present invention provides identical conductor capacitances for all read channels. This is accomplished by so adjusting both the lengths and widths of such conductors, that they all—from read channels to output pads—cover equal "areas" and hence provide equal capacitative loads to such read channels. As presently preferred, the invention additionally teaches fabricating individual integrated buffer amplifiers on the sensor chip, which amplifiers terminate equal capacitance signal conductors. Each buffer amplifier drives its related sensor output pad and, in so doing, isolates signal conductor capacitance from the effects of additional capacitative loading due to external circuits.

DESCRIPTION OF THE INVENTION

Figure 3:
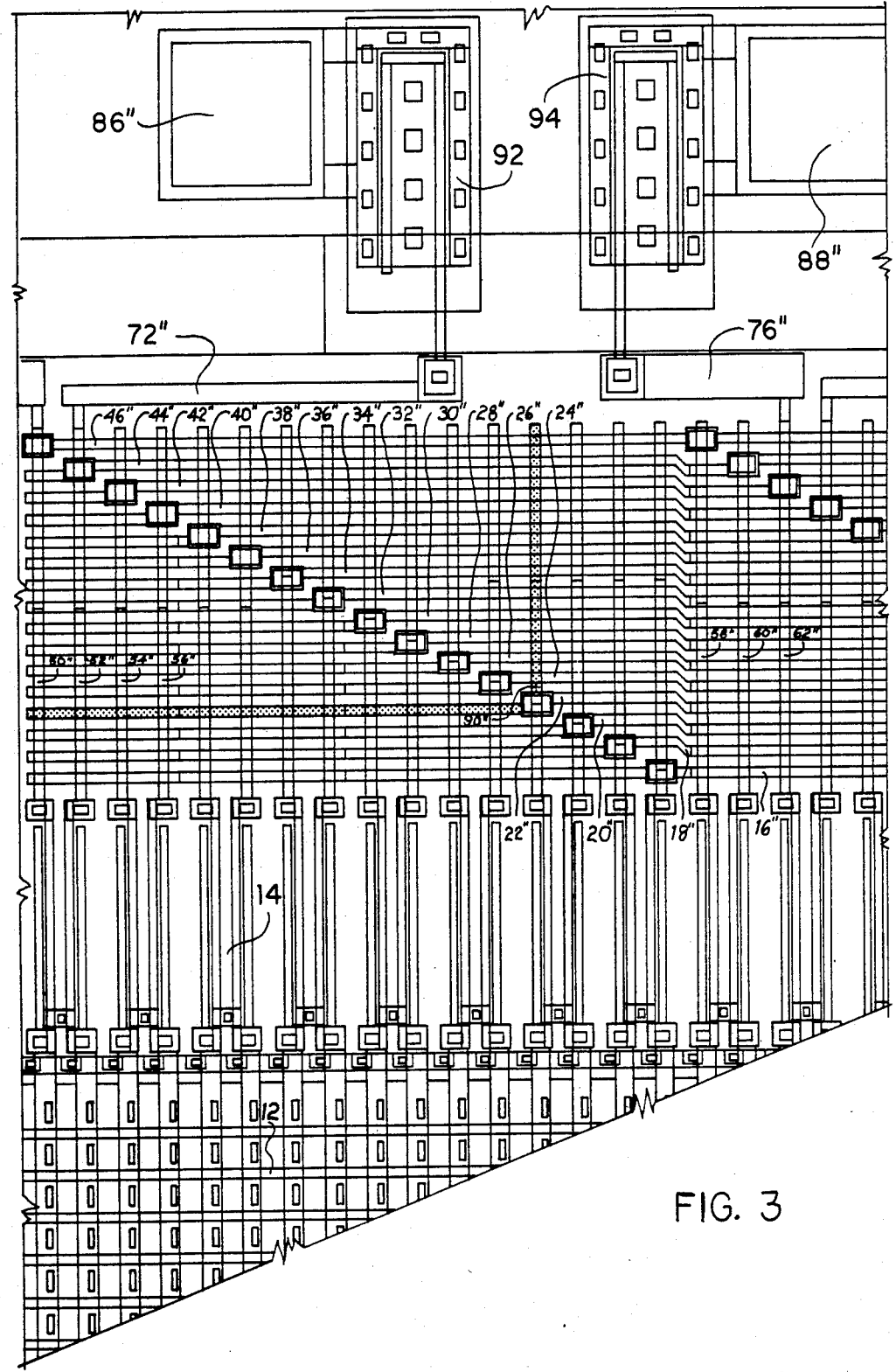
FIG. 3 is an expanded layout drawing of a section of a sensor according to the present invention, and which drawing illustrates a solution to the aforesaid problem.

The solution to the previously described problem may be understood by reference to FIG. 3 where a sensor layout in accordance with the invention is illustrated. The invention in one embodiment thereof teaches extending (see stippling) the conductor 90", past the junction with the bus conductor 22", this being in contrast with the truncated conductor 90' (FIG. 2) that connects with the bus conductor 22'. Similarly, the bus conductor 22" is not truncated at the junction with the conductor 90", but is extended (again, see stippling) across the array from the first to last row of the sensor. All the conductors comprising the block matrix are so extended in both directions. The result of such conductor extensions is to "normalize" the conductor lengths, and hence the conductor capacitances throughout the entire conductor array. With the block matrix, for any conductor, such as 90", capacitance contributed by the conductor 90" and its associated bus conductor 22" equals the capacitance of any other conductor, such as 56", and its bus conductor 40". Any unbalance among the capacitances driven by the read channels of the array, therefore, is due solely to the output leads from the block matrix to the signal output pads. To reconcile such unbalanced capacitances the areas covered by such output leads are also made equal. As will be appreciated from FIG. 3, and in consideration of the typical output leads 72" and 74", a further teaching of the invention is for the width of each given output lead be customized to meet the equi-area requirements: Because the lead 72" is longer than the lead 76", the lead 72" is therefore made narrower than the lead 76", thereby to make the areas of the leads 72", 76" equal.

Having normalized sensor capacitances as previously described, the invention further teaches isolation of such normalized capacitances from additional capacitative loading due to connection with off-chip circuits: Amplifiers, e.g. 92 and 94, are fabricated by integrated circuit techniques on the sensor substrate and terminate respective output leads 72" and 76". The outputs of the amplifiers 92 and 94 drive their associated output pads 86" and 88", and serve to provide the indicated isolation.

The invention has been described in detail with particular reference to preferred embodiments thereof, but it will be understood that variation and modifications can be effected within the spirit and scope of the invention.

What is claimed is:

1. In a solid state area image sensor of the type having an integral block matrix of conductors disposed for block readout of said sensor, the improvement wherein said sensor further comprises means for normalizing the conductor-to-substrate capacitances of said block matrix of conductors.

2. The improved solid state area image sensor of claim 1, further comprising:
   a. output leads respective of and associated with said block matrix for readout thereof, and
   b. means integral with said sensor for normalizing the lead-to-substrate capacitances associated with said output leads, whereby capacitative loading associated with said leads is uniform.

3. The improved area image sensor of claim 2 wherein said output leads are of substantially uniform areal dimensions.

4. The improved area image sensor of claim 1 wherein conductors comprising said block matrix of conductors are of substantially uniform areal dimensions.

5. An improved solid state area image sensor of the type having an intrgral block matrix of conductors and associated output leads disposed for block readout of said sensor, wherein the improvement comprises:
   a. means forming part of said sensor for normalizing the conductor-to-substrate capacitances of said block matrix of conductors, and
   b. means integral with said sensor for normalizing the capacitances associated with said output leads, whereby the capacitative loading of circuit components which may be connected to and drivingly associated with said sensor is uniform.

6. The improved area image sensor of claim 5 wherein said sensor comprises:
   a. matrix conductors of substantially uniform areal dimensions, and
   b. outputs leads of substantially uniform areal dimensions.

7. The improved area image sensor of claim 6 further comprising a plurality of integrated circuit amplifiers integral with said sensor and disposed to buffer said block matrix of conductors and said output leads from said circuits components which may be connected to said sensor.

8. An area image sensor comprising:
   a. semiconductor substrate having a passivated insulating surface layer,
   b. photosite elements disposed on said substrate for converting incident radiation to corresponding electrical signals,
   c. gating means disposed for readout of said signals, and
   d. equi-areal conductor means for applying said read out signals to circuits external to said sensor, whereby said photosite elements generating said electrical signals are drivingly associated with equi-capacitative loading of said external circuits.

* * * * *